US008956461B2

(12) United States Patent
Hudson et al.

(10) Patent No.: US 8,956,461 B2
(45) Date of Patent: Feb. 17, 2015

(54) APPARATUSES, SYSTEMS AND METHODS FOR RAPID CLEANING OF PLASMA CONFINEMENT RINGS WITH MINIMAL EROSION OF OTHER CHAMBER PARTS

(75) Inventors: Eric Hudson, Berkeley, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 91 days.

(21) Appl. No.: 12/970,908

(22) Filed: Dec. 16, 2010

(65) Prior Publication Data

US 2011/0083697 A1  Apr. 14, 2011

Related U.S. Application Data

(62) Division of application No. 11/425,206, filed on Jun. 20, 2006, now Pat. No. 7,879,184.

(51) Int. Cl.
*B08B 6/00* (2006.01)
*H01J 37/32* (2006.01)
*B08B 7/00* (2006.01)

(52) U.S. Cl.
CPC ......... *H01J 37/32862* (2013.01); *B08B 7/0035* (2013.01); *H01J 37/32009* (2013.01); *H01J 37/32091* (2013.01); *H01J 37/321* (2013.01); *H01J 37/32596* (2013.01)
USPC ........................................................ 134/1.1

(58) Field of Classification Search
CPC ............. B08B 7/0035; H01J 37/32009; H01J 37/32091; H01J 37/321; H01J 37/32596; H01J 37/32862; H01J 37/32477
USPC ........................................................ 134/1.1
See application file for complete search history.

(56) References Cited

U.S. PATENT DOCUMENTS

| 5,006,192 A | 4/1991 | Deguchi |
| 5,534,751 A | 7/1996 | Lenz et al. |

(Continued)

FOREIGN PATENT DOCUMENTS

| JP | 11-121436 | 4/1999 |
| JP | 2000-30896 | 1/2000 |

(Continued)

OTHER PUBLICATIONS

PCT Written Opinion of the International Search Authority issued in International Application No. PCT/US 07/70265, mailed Dec. 5, 2007 (4 pages).

(Continued)

*Primary Examiner* — Michael Kornakov
*Assistant Examiner* — Douglas Lee
(74) *Attorney, Agent, or Firm* — Martine Penilla Group, LLP

(57) ABSTRACT

An apparatus used for rapid removal of polymer films from plasma confinement rings while minimizing erosion of other plasma etch chamber components is disclosed. The apparatus includes a center assembly, an electrode plate, a confinement ring stack, a first plasma source, and a second plasma source. The electrode plate is affixed to a surface of the center assembly with a channel defined along the external circumference therein. A first plasma source is disposed within the channel and along the external circumference of the center assembly, wherein the first plasma source is configured to direct a plasma to the inner circumferential surface of the confinement ring stack. A second plasma source located away from the first plasma source is configured to perform processing operations on a substrate within the etch chamber.

9 Claims, 9 Drawing Sheets

(56) References Cited

U.S. PATENT DOCUMENTS

| | | | |
|---|---|---|---|
| 5,627,435 A | 5/1997 | Jansen et al. | |
| 5,683,548 A | 11/1997 | Hartig et al. | |
| 5,710,486 A | 1/1998 | Ye et al. | |
| 5,763,851 A | 6/1998 | Forster et al. | |
| 5,788,778 A | 8/1998 | Shang et al. | |
| 6,003,526 A | 12/1999 | Lo et al. | |
| 6,014,979 A | 1/2000 | Van Autryve et al. | |
| 6,129,808 A | 10/2000 | Wicker et al. | |
| 6,182,602 B1 * | 2/2001 | Redeker et al. | 118/723 R |
| 6,201,219 B1 | 3/2001 | Sandhu et al. | |
| 6,257,168 B1 | 7/2001 | Ni et al. | |
| 6,362,110 B1 * | 3/2002 | Marks | 438/711 |
| 6,478,924 B1 | 11/2002 | Shamouilian et al. | |
| 6,527,911 B1 * | 3/2003 | Yen et al. | 156/345.43 |
| 6,528,947 B1 | 3/2003 | Chen et al. | |
| 6,557,248 B1 | 5/2003 | Shamouilian et al. | |
| 6,559,049 B2 | 5/2003 | Chen et al. | |
| 6,569,257 B1 | 5/2003 | Nguyen et al. | |
| 6,814,814 B2 | 11/2004 | Collins et al. | |
| 6,936,135 B2 * | 8/2005 | Antolik | 156/345.53 |
| 2002/0052114 A1 | 5/2002 | Marks | |
| 2002/0192370 A1 | 12/2002 | Metzner et al. | |
| 2005/0051100 A1 | 3/2005 | Chiang et al. | |
| 2005/0188923 A1 | 9/2005 | Cook et al. | |
| 2005/0230350 A1 | 10/2005 | Kao et al. | |
| 2005/0263070 A1 * | 12/2005 | Fink | 118/715 |
| 2005/0279384 A1 | 12/2005 | Guidotti | |

FOREIGN PATENT DOCUMENTS

| | | |
|---|---|---|
| WO | 01/75932 | 10/2001 |
| WO | 02/057506 | 7/2002 |

OTHER PUBLICATIONS

PCT International Search Report issued in International Application No. PCT/US 07/70265, mailed Dec. 5, 2007 (2 pages).

* cited by examiner

APPARATUSES, SYSTEMS AND METHODS FOR RAPID CLEANING OF PLASMA CONFINEMENT RINGS WITH MINIMAL EROSION OF OTHER CHAMBER PARTS

CLAIM OF PRIORITY

This application is a divisional application of U.S. application Ser. No. 11/425,206 entitled "Apparatuses, Systems and Methods for Rapid Cleaning of Plasma confinement Rings with Minimal Erosion of Other Chamber Parts" filed on Jun. 20, 2006 now U.S. Pat. No. 7,879,184 and incorporated herein by reference.

BACKGROUND

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During plasma processing the confinement ring or set of parallel rings surrounds a plasma etch chamber to prevent the plasma from spreading beyond the etch chamber to the larger vacuum chamber. Generally, these rings are designed to allow gas to flow through to the vacuum chamber while preventing the diffusion of plasma. The configuration is often used in conjunction with polymerizing plasma chemistries, which may be needed for selective etching of films or for deposition of films. Such polymers may be hydrocarbons, fluorocarbons and/or hydrofluorocarbons in composition, and may also include nitrogen, oxygen, silicon, aluminum, molybdenum, titanium, tantalum, copper, cobalt, or tungsten. The deposition of polymeric films on plasma etch chamber surfaces may be desirable in some case or detrimental in others. Regardless, there is often a need to remove the polymer films from the etch chamber surfaces after each plasma etching operation to maintain stable and unchanging reactor conditions throughout a production cycle.

Conventional methods to remove these films involve striking an in-situ cleaning plasma in the etch chamber when the wafer is not present. However, removing polymer films from the confinement ring(s) is often problematic. It is well known that most of the polymer deposition on the confinement rings is found at the inner diameter surfaces of these rings. Typically, the length of time required for in-situ cleaning is determined by the relatively inefficient removal rate of polymer films from the confinement ring(s). The other polymer-coated surfaces within the reactor may be fully cleaned by a significantly shorter exposure to the in-situ cleaning plasma. As a result of the relatively inefficient cleaning of the confinement rings, the cleaning process times may be longer than desired which reduces the throughput of the plasma etch chamber, ultimately adding to the cost and cycle time for producing the integrated circuit devices. To further complicate matters, in-situ cleaning often results in the premature erosion of expensive plasma etch chamber parts such as the electrostatic chuck and the upper electrode panel.

In view of the forgoing, there is a need for a rapid in-situ cleaning method, apparatus, or system that is effective at removing polymer films from plasma confinement rings while minimizing erosion of the other plasma etch chamber components.

SUMMARY

Broadly speaking, the present invention fills these needs by providing improved apparatuses, methods, and systems for rapid removal of polymer films from plasma confinement rings while minimizing erosion of other plasma etch chamber components. It should be appreciated that the present invention can be implemented in numerous ways, including as an apparatus, a method and a system. Several inventive embodiments of the present invention are described below.

In one embodiment, an apparatus used for rapid removal of polymer films from plasma confinement rings while minimizing erosion of other plasma etch chamber components is disclosed. The apparatus includes a center assembly, an electrode plate, a confinement ring stack, a first plasma source, and a second plasma source. The electrode plate is affixed to a surface of the center assembly with a channel defined along the external circumference therein. A first plasma source is disposed within the channel and along the external circumference of the center assembly, wherein the first plasma source is configured to direct a plasma to the inner circumferential surface of the confinement ring stack. A second plasma source located away from the first plasma source is configured to perform processing operations on a substrate within the etch chamber.

In another embodiment, a method for cleaning a confinement ring stack in a plasma chamber is disclosed. The confinement ring stack is moved substantially orthogonal to a wafer support in the plasma chamber so that the inner circumferential surface of the ring stack is positioned at a distance from a first plasma source. The first plasma source is positioned away from a second plasma source. A plasma gas is supplied to the chamber and a first quantity of plasma is supplied to the inner circumferential surface of the confinement ring stack using the first plasma source.

In still another embodiment, a different apparatus used for rapid removal of polymer films from plasma confinement rings while minimizing erosion of other plasma etch chamber components is disclosed. The apparatus includes a center assembly, an electrode plate, a plurality of confinement rings, a heating component, a first plasma source, and a second plasma source. The electrode plate is affixed to a surface of the center assembly with a channel defined along the external circumference therein. A first plasma source is disposed within the channel and along the external circumference of the center assembly, wherein the first plasma source is configured to direct a plasma to the inner circumferential surface of the plurality of confinement rings. A heating element is positioned proximate to the confinement rings and configured to supply heat to the inner circumferential surface of the rings. A second plasma source is located away from the first plasma source and is configured to perform processing operations on a substrate within the etch chamber.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for methods, apparatuses, and systems for rapid removal of polymer films from plasma confinement rings while minimizing erosion of other plasma etch chamber components. It will be obvious, however, to one skilled in the art, that the present invention may be practiced without some or all of these specific details. In other instances, well known process operations have not been described in detail in order not to unnecessarily obscure the present invention.

As used herein, a semiconductor substrate can be made of any silicon-based material. In one embodiment, the substrate is a semiconductor wafer, which is a thin slice of semiconductor material, such as a silicon crystal, upon which microcircuits are constructed by diffusion and deposition of various materials. In this document, the terms semiconductor substrate and semiconductor wafer are used inter-changeably. What is disclosed by the embodiments herein is essentially a method, apparatus, and system for in-situ cleaning of the confinement rings of a plasma etch chamber. As defined herein, in-situ cleaning of the confinement rings denotes cleaning of the rings occurring within the plasma etch chamber without requiring the rings to be removed from the chamber.

Figure 1A:
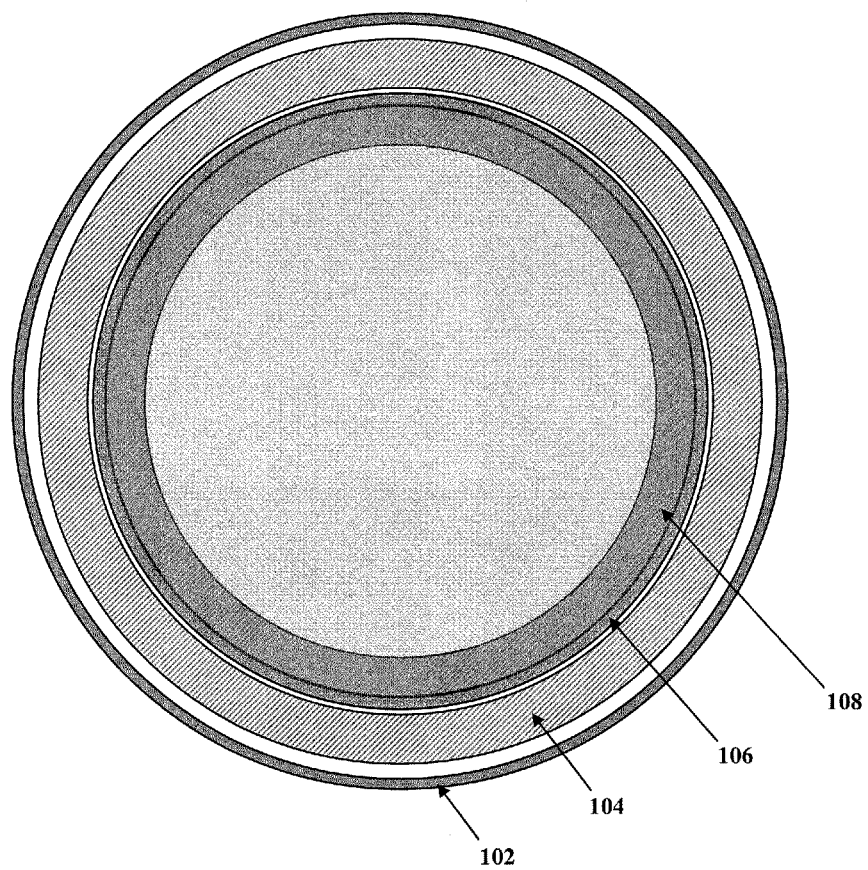
FIG. 1A, depicts a top-view illustration of the various functional components of a plasma etch chamber, in accordance with one embodiment of the present invention.

FIG. 1A, depicts a top-view illustration of the various functional components of a plasma etch chamber, in accordance with one embodiment of the present invention. In this embodiment, the plasma etch chamber 100 is depicted in successive concentric layers as including a chamber wall layer 102, confinement ring layer 104, and cleaning plasma source layer 108. The cleaning plasma source layer 108 is positioned adjacent to an inner circumferential surface of the confinement ring layer 104 and is configured to direct a cleaning plasma 106 towards the inner circumferential surface of the confinement ring layer 104 to effectuate removal of polymer contaminants from the inner circumferential surface of the confinement rings.

In one embodiment, the source of the cleaning plasma is an inductively coupled electrode. In another embodiment, the source of the plasma is a micro-hollow cathode array. In still another embodiment, the source of the plasma is a capacitively coupled electrode. It should be appreciated, that the cleaning plasma 106 can be supplied by any type of plasma source as long as the source can be positioned to expose all the inner circumferential surfaces of the confinement ring layer 104 to the cleaning plasma and can deliver a sufficient quantity of the cleaning plasma 106 to remove the polymer films from the inner circumferential surfaces confinement ring layer 104.

Continuing with FIG. 1A, in one embodiment, the confinement ring layer 104 is comprised of a single plasma ring. In another embodiment, the confinement ring layer 104 is comprised of a plurality of rings that are stacked on top of each other with gaps between them.

Figure 1B:
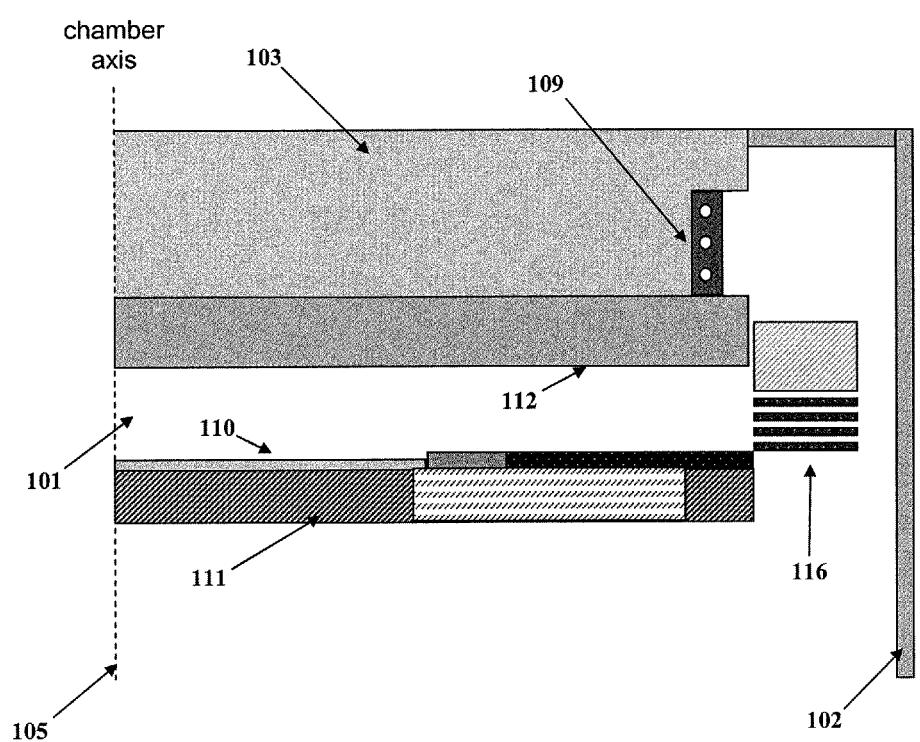
FIG. 1B, illustrates a cross sectional side-view of a plasma etch chamber with a stack of confinement rings in an un-elevated position, in accordance with one embodiment of the present invention.

FIG. 1B, illustrates a cross sectional side-view of a plasma etch chamber with a stack of confinement rings in an un-elevated position, in accordance with one embodiment of the present invention. In this depiction, a radial cross-section of the plasma etch chamber is shown extending from the chamber center axis 105 to the chamber wall 102. On the top side of the plasma chamber is a center assembly 103 coupled to a top surface of the upper electrode plate 112. A channel is defined along an exterior surface of the center assembly 103 facing the chamber wall 102. Disposed within the channel is an inductively couple plasma source 109 (i.e., coils plus housing) configured to strike a cleaning plasma 106 within a region proximate to the inner circumferential surfaces of the confinement ring stack. Positioned at the base of the plasma chamber is an electrostatic chuck (ESC) 110 that is coupled to a top surface of the bottom electrode plate 111. The space between the top and bottom electrodes 112, is the main etch chamber 101, where substrate plasma etching operations occur. The top 112 and bottom electrodes 111 are configured to strike a plasma within the main etch chamber 101 to etch a substrate placed on the ESC 110.

As depicted herein, the stack of confinement rings 116 is shown in an un-elevated position which is typical during a plasma etching operation. In one embodiment, a plurality of rods (not depicted) is inserted through the confinement rings substantially orthogonal to the bottom electrode plate 111. The rods serve as guide rails that are configured to operate in conjunction with a motorized drive (not depicted) to elevate the stack of confinement rings 116 so that the stack 116 is substantially adjacent to the inductively couple plasma source 109 at the end of a plasma etching operation. The ring drive system may be any drive system currently available.

In one embodiment, the power settings of the inductively coupled plasma source 109 are between about 100 Watts to about 2000 Watts. In another embodiment, the power settings are between about 400 Watts and 1500 Watts. In still another embodiment, the power settings are between about 800 Watts and 1200 Watts. It should be understood, however, that the inductively coupled plasma source 109 can essentially be set to any power setting as long as the resulting cleaning plasma 106 can remove the polymer contaminants from the inner circumferential surfaces of the confinement rings 116 without causing damage to the rings or other etch chamber components (e.g., ESC 110, electrodes 111-112, etc.).

Figure 1C:
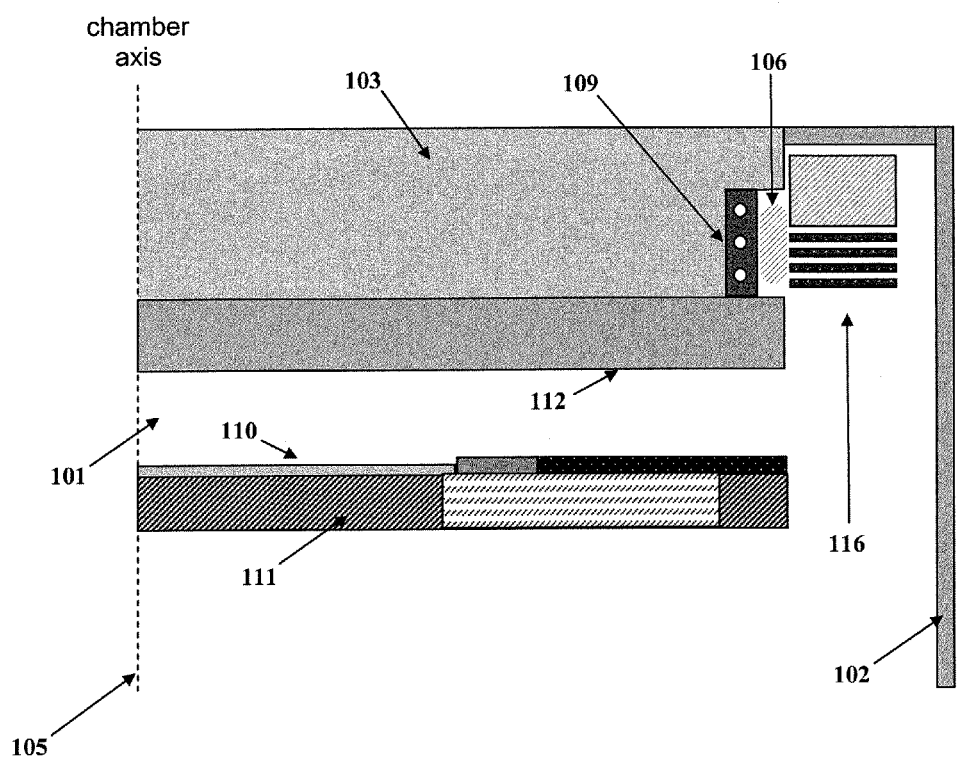
FIG. 1C is a cross sectional side-view of a plasma etch chamber with a dedicated inductively coupled plasma source positioned adjacent to a stack of confinement rings in an elevated position, in accordance with one embodiment of the present invention.

FIG. 1C is a cross sectional side-view of a plasma etch chamber with a dedicated inductively coupled plasma source positioned adjacent to a stack of confinement rings in an elevated position, in accordance with one embodiment of the present invention. As depicted herein, a radial cross-section of the plasma etch chamber is shown extending from the chamber center axis 105 to the chamber wall 102. On the top side of the plasma chamber is a center assembly 103 coupled to a top surface of the upper electrode plate 112. A channel is defined along an exterior surface of the center assembly 103 facing the chamber wall 102. Disposed within the channel is an inductively coupled plasma source 109 (i.e., coils plus housing) configured to direct a cleaning plasma 106 against an inner circumferential surface of the stack of rings 116. It should be understood that although the inductively coupled plasma source 109 is depicted as being disposed along the base of the channel in this illustration (i.e., FIG. 1C), this is not meant to limit the manner in which the source 109 can be disposed within the channel. The inductively coupled plasma source 109 can be disposed in any arrangement, position, or orientation within the channel as long as the source 109 can be configured to direct a sufficient quantity of plasma to substantially clean the inner circumferential surfaces of the confinement rings. Positioned at the base of the plasma chamber is an electrostatic chuck (ESC) 110 that is coupled to a top surface of the bottom electrode plate 111. As indicated above, the space between the top and bottom electrodes 111, is the main etch chamber space 101, where substrate plasma etching operations occur. The top 112 and bottom electrodes 111 are configured to strike a plasma within the etch chamber 101 to etch a substrate placed on the ESC 110.

In this embodiment, the stack of confinement rings 116 is shown in an elevated position where a dedicated inductively coupled plasma source 109 is configured to direct a cleaning plasma 106 against the inner circumferential surfaces of the stack of rings 116 to substantially remove any contaminant build-up (e.g., polymers, etc.) on those surfaces. In one embodiment, the distance between the inner circumferential surfaces of the rings 116 and the outer surface of the inductively coupled plasma source 109 (i.e., coils plus housing) is between about 0.5 millimeters (mm) and about 15 mm. In another embodiment, the distance is between about 1 mm and about 10 mm. In still yet another embodiment, the distance is between about 2 mm and about 5 mm. It should be understood that the distance between the inner circumferential surface of the confinement rings 116 and the outer surface of the inductively coupled plasma source 109 is related to multiple factors including the temperature of the rings 116, the pressure maintained within the channel where the inductively coupled plasma source 109 is disposed, and the power setting of the inductively coupled plasma source 109. The distance maintained between the outer surface of the inductively coupled plasma source 109 and the inner circumferential surface of the rings 116 can essentially be set to any value so long as the inductively coupled plasma source 109 removes the polymer contaminants deposited on the rings 116 without causing damage to the rings 116. In one embodiment, the temperature of the rings 116 is maintained at between about 25° C. to about 500° C. In another embodiment, the temperature of the rings 116 is set at between about 100° C. to 400° C. In still another embodiment, the temperature of the rings 116 is set at between 270° C. and 330° C.

In general, the removal rate of polymer contaminants from the confinement rings 116 is dependent upon the temperature of the rings 116. The higher the temperature that the rings 116 are kept at, the higher the contaminant removal rate from the rings 116. It should be appreciated that the temperature of the rings 116 can be set to any value as long as the setting does not damage the various components (e.g., ESC 110, electrodes 111-112, etc.) of the plasma etch chamber and achieves an adequate contaminant removal rate is achieved.

In one embodiment, the pressure setting of the space between the outer surface of the inductively coupled plasma source 109 and the inner circumferential surface of the confinement rings 116 is maintained at between about 1 millitorr and 1 torr. In another embodiment, the pressure setting of the space is set at between 5 millitorr and 100 millitorr. In still another embodiment, the pressure setting of the space is set at between 10 millitorr and 50 millitorr. It should be appreciated that the pressure can be set to any value as long as the density of the cleaning plasma 106 struck by the inductively coupled plasma source 109 is sufficient to adequately remove the polymer contaminants from the surfaces of the confinement rings 116.

Figure 1D:
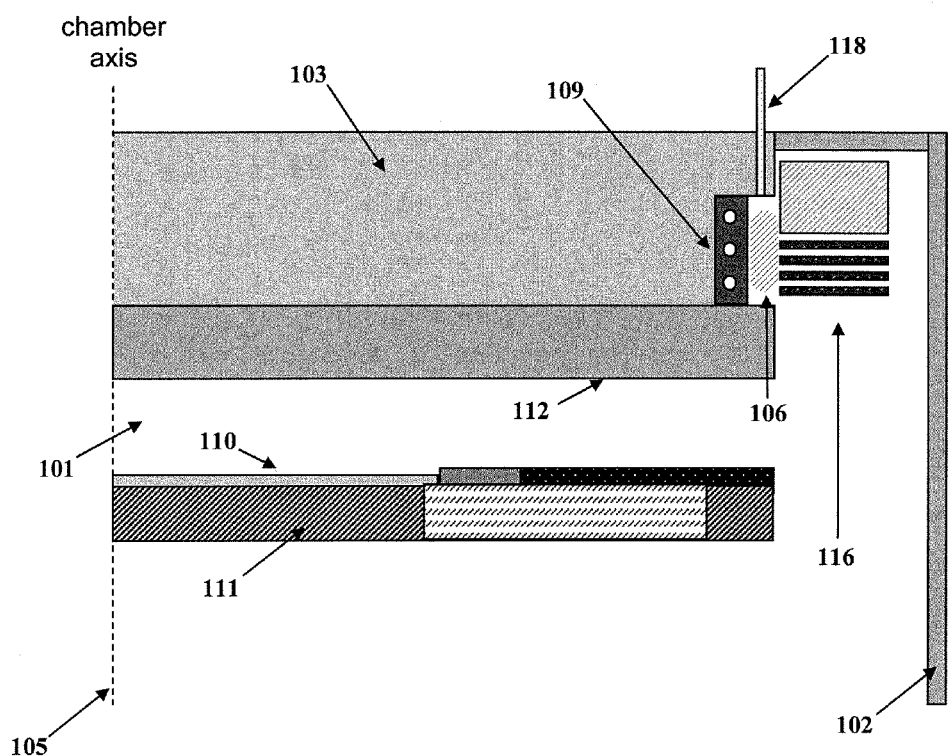
FIG. 1D is a cross sectional side-view of a plasma etch chamber with a dedicated inductively coupled plasma source positioned adjacent to a stack of confinement rings in an elevated position, in accordance with one embodiment of the present invention.

FIG. 1D is a cross sectional side-view of a plasma etch chamber with a dedicated inductively coupled plasma source positioned adjacent to a stack of confinement rings in an elevated position, in accordance with one embodiment of the present invention. In this depiction, a radial cross-section of the plasma etch chamber is shown extending from the chamber center axis 105 to the chamber wall 102. On the top side of the plasma chamber is a center assembly 103 coupled to a top surface of the upper electrode plate 112. A channel is defined along an exterior surface of the center assembly 103 facing the chamber wall 102. Disposed within the channel is an inductively couple plasma source 109. A gas delivery line 118 is shown boring through the top surface of the center assembly 103 and into the space defined within the channel. The gas delivery line 118 is configured to deliver a feed gas to the space during the striking of the cleaning plasma 106 by the inductively coupled plasma source 109. Positioned at the base of the plasma chamber is an electrostatic chuck (ESC) 110 that is coupled to a top surface of the bottom electrode plate 111.

In one embodiment, the feed gas heated to a temperature of between about 100° C. and about 500° C. before being delivered to the space defined within the channel. The heated gas increases the temperature of the inner circumferential surface of the confinement rings 116 to improve the overall contaminant removal rate achieved by the cleaning plasma 106. Generally, the space within the channel has to be substantially gas tight to allow the inner circumferential surface of the confinement rings 116 to be sufficiently heated by the heated plasma gas. Examples of feed gases delivered by the plasma gas delivery line 118 include: $O_2$, $O_3$, $H_2O$, $H_2O_2$, $CO_2$, CO, $N_2$, $NH_3$, $H_2$, $CF_4$, $C_2F_6$, $NF_3$, $SF_6$, $F_2$, $XeF_2$, He, Ne, Ar, Kr, Xe, and combinations thereof. However, it should be understood that essentially any type of feed gas can be delivered by the gas line 118 as long as a cleaning plasma 106 that can adequately remove the polymer contaminants from the inner circumferential surfaces of the confinement rings 116 is created.

Figure 2:
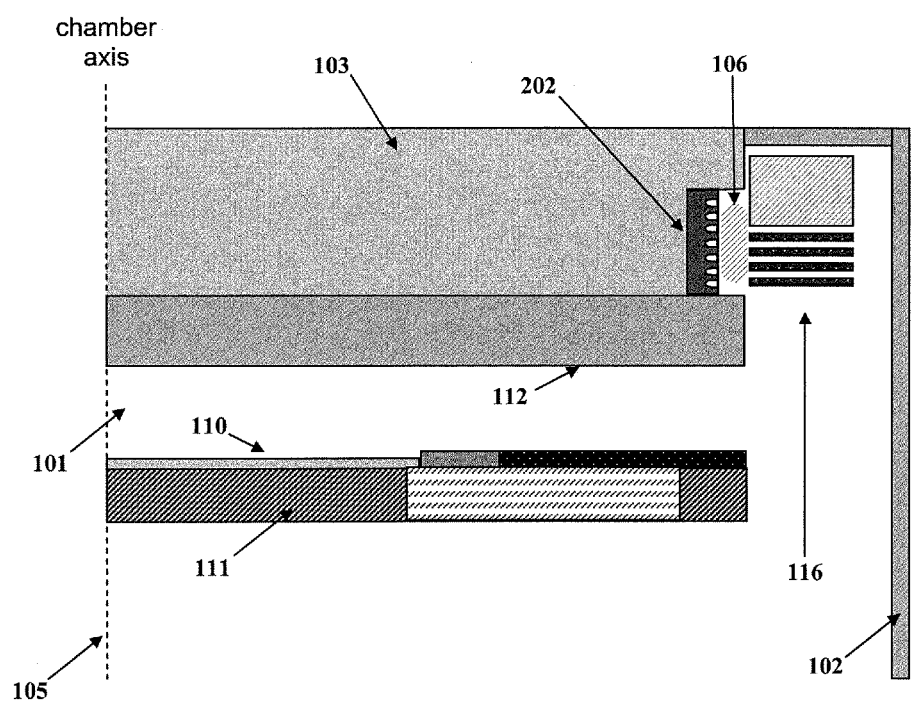
FIG. 2 is a cross sectional side-view of a plasma etch chamber with a dedicated micro hollow-cathode array plasma source positioned adjacent to a stack of confinement rings in an elevated position, in accordance with one embodiment of the present invention.

FIG. 2 is a cross sectional side-view of a plasma etch chamber with a dedicated micro hollow-cathode array plasma source positioned adjacent to a stack of confinement rings in an elevated position, in accordance with one embodiment of the present invention. In this depiction, a radial cross-section of the plasma etch chamber is shown extending from the chamber center axis 105 to the chamber wall 102. On the top side of the plasma chamber is a center assembly 103 coupled to a top surface of the upper electrode plate 112. A channel is defined along an exterior surface of the center assembly 103 facing the chamber wall 102. Disposed within the channel is a micro hollow-cathode array plasma source 202 configured to strike a cleaning plasma 106 against the inner circumferential surface of a stack of confinement rings 116. Positioned at the base of the plasma chamber is an electrostatic chuck (ESC) 110 that is coupled to a top surface of the bottom electrode plate 111. The space between the top 112 and bottom electrodes 111, is the main etch chamber 101, where substrate plasma etching operations occur. The top 112 and bottom electrodes 111 are configured to strike a plasma within the etch chamber 101 to etch a substrate placed on the ESC 110.

In this embodiment, the cleaning plasma 106 is struck to substantially removes any contaminant build-up (e.g., polymers, etc.) on the inner circumferential surfaces of the stack of confinement rings 116. In one embodiment, the distance between the inner circumferential rings 116 and the micro hollow-cathode array plasma source 202 is between about 0.5 millimeters (mm) and about 10 mm. In another embodiment, the distance is between about 1 mm and about 5 mm. In still yet another embodiment, the distance is between about 1 mm and about 2 mm. It should be understood that the distance maintained between the micro hollow-cathode array plasma source 202 and the inner circumferential surface of the rings 116 can essentially be set to anything value so long as the micro hollow-cathode array plasma source 202 can be configured to remove the polymer contaminants deposited on the rings 116 without causing damage to the rings 116.

Still with FIG. 2, in one embodiment, a gas delivery line bores through the top surface of the center assembly 103 and into the space defined within the channel. The gas delivery line is configured to deliver a gas to the space during the operation of the cleaning plasma 106 by micro hollow-cathode array plasma source 202. The feed gas may alternatively be delivered heated or at room temperature depending on the requirements of the particular confinement ring 116 cleaning operation.

In one embodiment, the micro hollow-cathode array plasma source 202 is configured to have a plurality of micro hollow-cathode cavities that are substantially uniformly arrayed on a source surface that is positioned facing towards the inner circumferential surface of the stack of confinement rings 116. In one embodiment, the cavities have an internal diameter of between about 100 microns and about 5000 microns. In another embodiment, the cavities have internal diameters of between about 500 microns to about 3000 microns. In still another embodiment, the cavities have internal diameters of between about 500 microns and about 2000 microns. It should be understood, that the choice of internal diameter of the cavities is related to the plasma operating pressure within the space defined between the micro hollow-cathode array plasma source 202 and the confinement rings 116. Generally, the smaller the internal diameter of the cavity, the higher the pressure that is required in order for the micro hollow-cathode array plasma source 202 to maintain a cleaning plasma 106 that achieves the same contaminant removal rate.

Continuing with FIG. 2, in one embodiment, the pressure within the space defined between the micro hollow-cathode array plasma source 202 and the confinement rings 116 is between about 100 millitorr and about 100 torr. In another embodiment, the pressure within the space is between about 400 millitorr and about 10 torr. In still another embodiment, the pressure within the space is between about 500 millitorr and 3 torr. In one embodiment, the electric potential setting for the plurality of micro hollow-cathode cavities that are arrayed along the surface of the micro hollow-cathode array plasma source 202 has a value of between about −10 volts and about −2000 volts. In another embodiment, the electric potential setting has a value of between about −50 volts and about −500 volts. In still another embodiment, the electric potential setting has a value of between about −100 volts and −300 volts.

Figure 3:
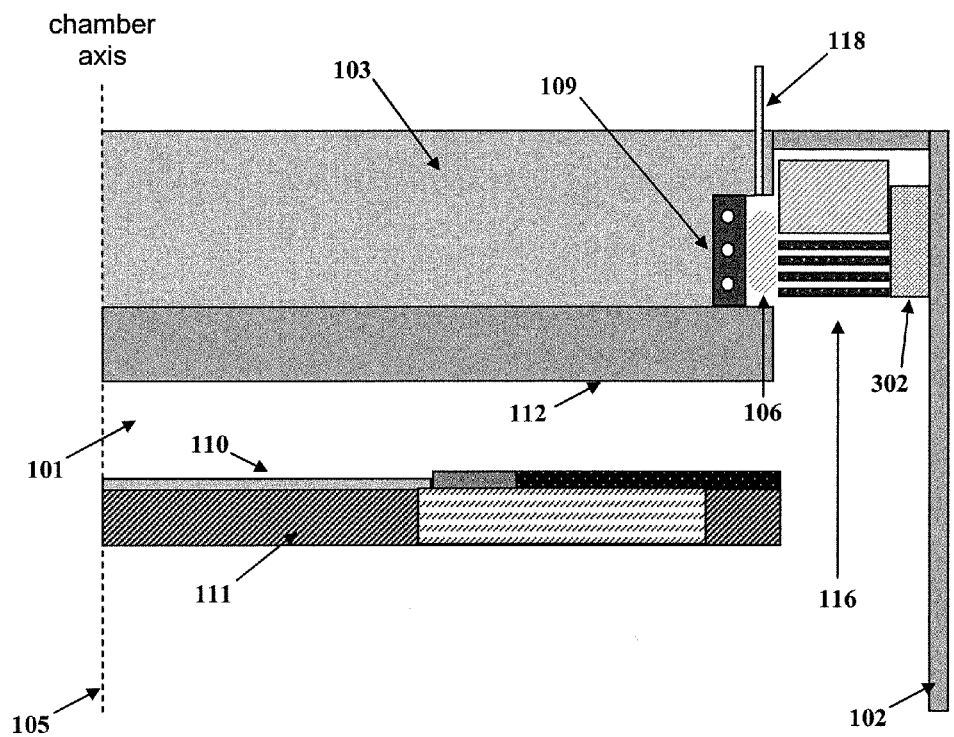
FIG. 3 is a cross sectional side-view of a plasma etch chamber with a dedicated inductively coupled plasma source positioned adjacent to a stack of confinement rings in an elevated position, in accordance with one embodiment of the present invention.

FIG. 3 is a cross sectional side-view of a plasma etch chamber with a dedicated inductively coupled plasma source positioned adjacent to a stack of confinement rings in an elevated position, in accordance with one embodiment of the present invention. In this depiction, a radial cross-section of the plasma etch chamber is shown extending from the chamber center axis 105 to the chamber wall 102. On the top side of the plasma chamber is a center assembly 103 coupled to a top surface of the upper electrode plate 112. A channel is defined along an exterior surface of the center assembly 103 facing the chamber wall 102. Disposed within the channel is an inductively coupled plasma source 109 configured to direct a cleaning plasma 106 against the inner circumferential surface of a stack of confinement rings 116. A gas delivery line 118 is shown boring through the top surface of the center assembly 103 and into the space defined within the channel. The gas delivery line 118 is configured to deliver a gas to the space during the striking of the cleaning plasma 106 by the inductively coupled plasma source 109.

Further, in this embodiment, a shield 302 is coupled to the chamber wall 102 is configured to provide a substantially gas tight seal against the outer circumference of a stack of confinement rings 116 to prevent feed gases from escaping through the gaps between the individual confinement rings. It should be understood that the shield 302 can be made out of essentially any material as long as the material is not reactive with the cleaning plasma 106 to create contaminant by-products.

Figure 4A:
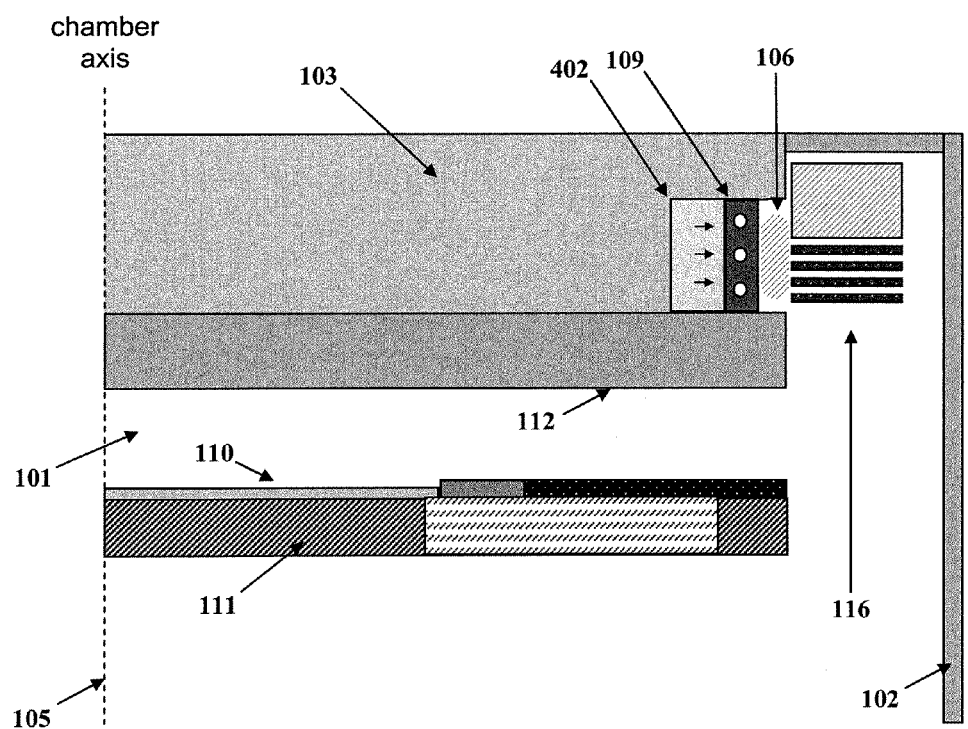
FIG. 4A is an illustration of a side-view of a plasma etch chamber with a heating component coupled to a dedicated inductively coupled plasma source positioned adjacent to a stack of confinement rings in an elevated position, in accordance with one embodiment of the present invention.

FIG. 4A is an illustration of a side-view of a plasma etch chamber with a heating component coupled to a dedicated inductively coupled plasma source positioned adjacent to a stack of confinement rings in an elevated position, in accordance with one embodiment of the present invention. In this embodiment, a radial cross-section of the plasma etch chamber is shown extending from the chamber center axis 105 to the chamber wall 102. On the top side of the plasma chamber is a center assembly 103 coupled to a top surface of the upper electrode plate 112. A channel is defined along an exterior surface of the center assembly 103 facing the chamber wall 102. Disposed within the channel is a heating component 402 positioned in between the center assembly 103 and an inductively coupled plasma source 109. The heating component 402 is configured to heat the stack of confinement rings 116 to a pre-determined temperature range of between about 25° C. to about 500° C. as described above. The inductively coupled plasma source 109 is configured to direct a cleaning plasma 106 against the inner circumferential surface of a stack of confinement rings 116.

In one embodiment, the heating component 402 is an irradiative heating device such as a quartz heat lamp. However, it should be appreciated that the heating component 402 can be any heating device type as long as the component 402 can provide adequate heating of the confinement rings 116 during a cleaning plasma etching operation to remove polymer contaminants off the inner circumferential surface of the confinement ring stack 116. In another embodiment, the heating component 402 is a resistive heater with a radiative thermal coupling to the confinement rings 116.

Continuing with FIG. 4A, in one embodiment, the heating component 402 is positioned in between the confinement ring stack 116 and the plasma etch chamber wall 102. The heating component 402 being coupled to the plasma etch chamber wall 102 and configured to provide irradiative heating of the confinement ring stack 116 as the inductively coupled plasma source 109 directs a cleaning plasma 106 against the inner circumferential surface of the confinement ring stack 116 to effectuate removal of the polymer contaminants. It should be understood that the heating component 402 can be positioned at essentially any location within the plasma etch chamber as long as the component 402 can operate to heat the stack of rings 116 to a temperature of between about 25° C. to about 500° C.

Figure 4B:
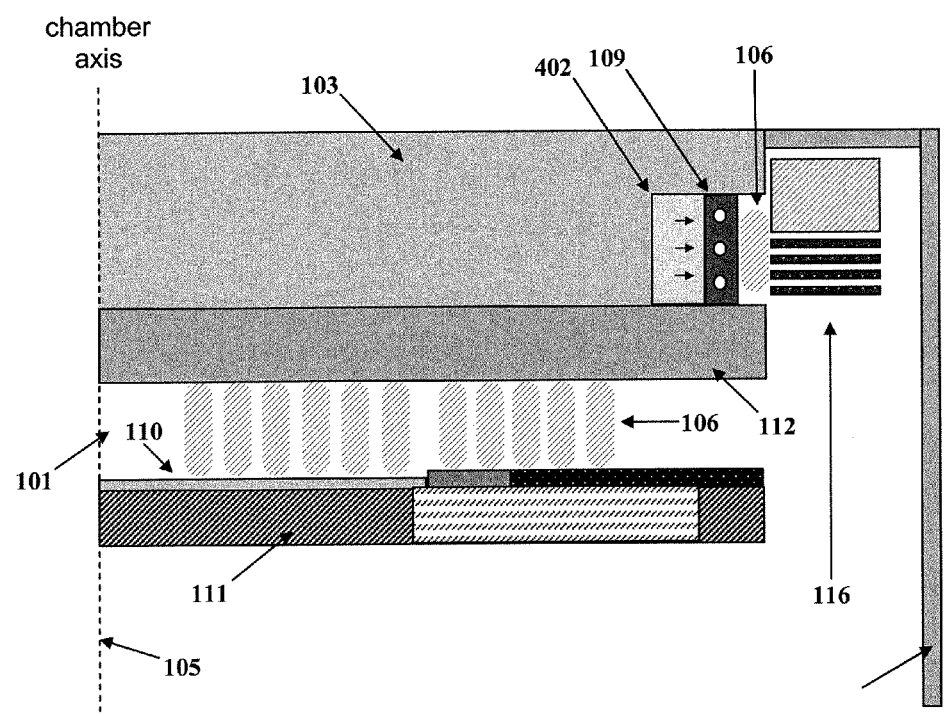
FIG. 4B is a side-view of a plasma etch chamber operating in a simultaneous etch chamber cleaning mode, in accordance with one embodiment of the present invention.

FIG. 4B is a side-view of a plasma etch chamber operating in a simultaneous etch chamber cleaning mode, in accordance with one embodiment of the present invention. In this embodiment, a radial cross-section of the plasma etch chamber is shown extending from the chamber center axis 105 to the chamber wall 102. On the top side of the plasma chamber is a center assembly 103 coupled to a top surface of the upper electrode plate 112. A channel is defined along an exterior surface of the center assembly 103 facing the chamber wall 102. Disposed within the channel is a heating component 402 positioned in between the center assembly and an inductively coupled plasma source 109.

As depicted, the plasma etch chamber is shown performing a simultaneous etching operation to remove polymer contaminants from the main etch chamber 101 and the confinement rings 116. The cleaning plasma 106 for cleaning the etch chamber is struck using electrodes 112 positioned above and below 111 the ESC 110, whereas the cleaning plasma 106 for cleaning the confinement rings 116 generated by the inductively coupled plasma source 109.

Figure 5:
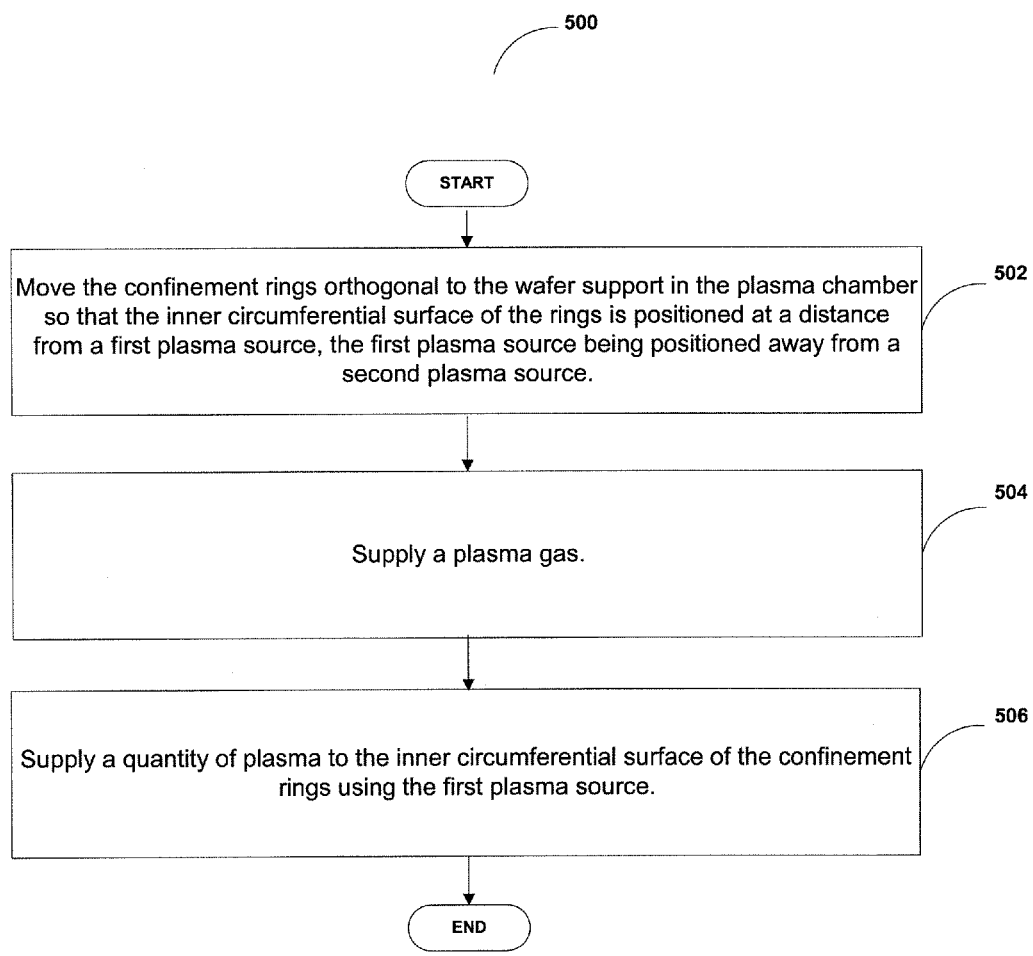
FIG. 5 shows a flow chart of a method for cleaning a plurality of confinement rings in a plasma chamber, in accordance with one embodiment of the present invention.

FIG. 5 shows a flow chart of a method for cleaning a plurality of confinement rings in a plasma chamber, in accordance with one embodiment of the present invention. Diagrams of the apparatus utilized in this method are shown in FIGS. 1A-1D. Method 500 begins with operation 502 where the confinement rings are moved so that the inner circumferential surface of the rings is positioned at a distance from the first plasma source. The first plasma source being positioned so that the source directs a plasma towards an inner circumferential surface of the confinement rings when the confinement rings are in an elevated or lowered position from the second plasma source. In one embodiment, the first plasma source is an inductively coupled plasma source, wherein the distance between the plasma source and the confinement ring stack is between about 0.5 mm and about 15 mm. In another embodiment, the first plasma source is a micro hollow-cathode array plasma source, wherein the distance between the plasma source and confinement ring stack is between about 0.5 mm and about 10 mm.

In relating the locations of the first plasma source and the second plasma source to the descriptions provided above, the first plasma source is located in the channel defined along an exterior surface of the center assembly facing the chamber wall, whereas the second plasma source relates to the electrode plates in the main etch chamber. Next, the method moves on to operation 504 where a feed gas is supplied to the plasma etch chamber. Examples of plasma etch gases include: $O_2$, $O_3$, $H_2O$, $H_2O_2$, $CO_2$, $CO$, $N_2$, $NH_3$, $H_2$, $CF_4$, $C_2F_6$, $NF_3$, $SF_6$, $F_2$, $XeF_2$, He, Ne, Ar, Kr, Xe, and combinations thereof.

The method then proceeds to operation 506 where a quantity of plasma is supplied to the inner circumferential surface of the confinement rings using the first plasma source. In one embodiment, plasma source is an inductively coupled plasma source configured to deliver a plasma density of cleaning plasma of between about 5e9 $cm^{-3}$ to about 5e12 $cm^{-3}$. In another embodiment, the plasma source is a micro hollow-cathode array plasma source configured to deliver a plasma density of cleaning plasma of between about 5e9 $cm^{-3}$ to about 5e12 $cm^{-3}$.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A method for cleaning a confinement ring stack, comprising:

providing a plasma chamber having a top electrode and a bottom electrode, the top electrode being disposed over the bottom electrode so as to define a first plasma processing region powered by a first plasma source and disposed between the top electrode and the bottom electrode, and the confinement ring stack being configured to move between a lower position and an upper position, the upper position being located above the top electrode and adjacent to a second plasma processing region powered by a second plasma source, the second plasma processing region being separate from the first plasma processing region and each plasma processing region being powered by a respective one of the first and second plasma sources;

moving the confinement ring stack to the upper position;

generating a cleaning plasma within the second plasma processing region and adjacent to an inner circumferential surface of the confinement ring stack when the confinement ring stack is in the upper position, the cleaning plasma being used to perform a cleaning operation on the confinement ring stack; and moving the confinement ring stack to the lower position when the cleaning operation using the cleaning plasma is finished, the confinement ring stack in the lower position defining a processing volume between the top electrode and the bottom electrode within the first plasma processing region.

2. The method of claim 1, further comprising:

providing a shield against an outer circumferential surface of the confinement ring stack when the confinement ring stack is in the upper position.

3. The method of claim 1, wherein the cleaning plasma is generated using the second plasma source, the second plasma source being one of an inductively coupled electrode, a micro-hollow cathode array, or a capacitively coupled electrode.

4. The method of claim 1, wherein the generating of the cleaning plasma includes heating a gas used to generate the cleaning plasma.

5. A method for processing a substrate in a plasma chamber, comprising:

performing a plasma processing operation on a substrate in a main chamber space defined in the plasma chamber, the main chamber space being defined between a top electrode and a bottom electrode, the plasma processing operation being performed using a plasma generated in the main chamber space using a first plasma source, and the plasma processing operation being performed with a confinement ring stack in a lower position so as to surround the main chamber space, wherein the plasma chamber has the confinement ring stack in an upper position located above the top electrode and adjacent to a cleaning plasma generation region for cleaning the confinement ring stack using a cleaning plasma generated in the cleaning plasma generation region using a second plasma source.

6. The method of claim 5, further comprising:
providing a shield against an outer circumferential surface of the confinement ring stack for cleaning of the confinement ring stack with the confinement ring stack in the upper position.

7. The method of claim 5, wherein the second plasma source used to generate the cleaning plasma is one of an inductively coupled electrode, a micro-hollow cathode array, or a capacitively coupled electrode.

8. The method of claim 5, wherein the confinement ring stack is movable between the lower position and the upper position within a channel defined in the plasma chamber.

9. The method of claim 5, wherein the cleaning of the confinement ring stack using the cleaning plasma includes heating a gas used to generate the cleaning plasma.

* * * * *